United States Patent [19]
Hayashi

[11] Patent Number: 5,809,079
[45] Date of Patent: Sep. 15, 1998

[54] BRANCHMETRIC CALCULATION CIRCUIT IN A VITERBI DECODER

[75] Inventor: Hideki Hayashi, Tsurugashima, Japan

[73] Assignee: Pioneer Electronic Corporation, Tokyo, Japan

[21] Appl. No.: 573,362

[22] Filed: Dec. 15, 1995

[30] Foreign Application Priority Data

Dec. 19, 1994 [JP] Japan .................................. 6-314922

[51] Int. Cl.⁶ .............................. H04L 5/12; H04L 23/02
[52] U.S. Cl. ......................... 375/262; 375/341; 371/43.7
[58] Field of Search ................................... 375/265, 341, 375/262; 371/43, 43.1, 43.7; 364/754, 757, 758, 759, 760

[56] References Cited

U.S. PATENT DOCUMENTS 4,700,319  10/1987  Steiner ............................... 364/736.05

Primary Examiner—Don N. Vo
Attorney, Agent, or Firm—Sughrue, Mion, Zinn, Macpeak & Seas, PLLC

[57] ABSTRACT

A branchmetric calculation circuit in a Viterbi decoder capable of fast decoding with a small circuit scale. Square calculation for deriving a square of a subtraction result value between a received sample value and a predicted sample value is performed by broken line approximation using a plurality of linear functions.

2 Claims, 18 Drawing Sheets

FIG. 8

| SUBTRACTION RESULT X | | BRANCHMETRIC VALUE Y | |
|---|---|---|---|
| BINARY (2'sc) X3 X2 X1 X0 | DECIMAL | BINARY (SB) Y3 Y2 Y1 Y0 | DECIMAL |
| 0 1 1 1 | 7 | 1 0 1 0 | 10 |
| 0 1 1 0 | 6 | 1 0 0 0 | 8 |
| 0 1 0 1 | 5 | 0 1 1 0 | 6 |
| 0 1 0 0 | 4 | 0 1 0 0 | 4 |
| 0 0 1 1 | 3 | 0 0 1 1 | 3 |
| 0 0 1 0 | 2 | 0 0 1 0 | 2 |
| 0 0 0 1 | 1 | 0 0 0 1 | 1 |
| 0 0 0 0 | 0 | 0 0 0 0 | 0 |
| 1 1 1 1 | −1 | 0 0 0 0 | 0 |
| 1 1 1 0 | −2 | 0 0 0 1 | 1 |
| 1 1 0 1 | −3 | 0 0 1 0 | 2 |
| 1 1 0 0 | −4 | 0 0 1 1 | 3 |
| 1 0 1 1 | −5 | 0 1 0 0 | 4 |
| 1 0 1 0 | −6 | 0 1 1 0 | 6 |
| 1 0 0 1 | −7 | 1 0 0 0 | 8 |
| 1 0 0 0 | −8 | 1 0 1 0 | 10 |

2'sc : 2's complement

SB : Straight Binary

FIG.13

| SUBTRACTION RESULT X | | BRANCHMETRIC VALUE Y | |
|---|---|---|---|
| BINARY (2'sc) X3 X2 X1 X0 | DECIMAL | BINARY (SB) Y3 Y2 Y1 Y0 | DECIMAL |
| 0 1 1 1 | 7 | 1 1 0 0 | 12 |
| 0 1 1 0 | 6 | 1 0 0 0 | 8 |
| 0 1 0 1 | 5 | 0 1 1 0 | 6 |
| 0 1 0 0 | 4 | 0 1 0 0 | 4 |
| 0 0 1 1 | 3 | 0 0 1 0 | 2 |
| 0 0 1 0 | 2 | 0 0 0 1 | 1 |
| 0 0 0 1 | 1 | 0 0 0 0 | 0 |
| 0 0 0 0 | 0 | 0 0 0 0 | 0 |
| 1 1 1 1 | −1 | 0 0 0 0 | 0 |
| 1 1 1 0 | −2 | 0 0 0 0 | 0 |
| 1 1 0 1 | −3 | 0 0 0 1 | 1 |
| 1 1 0 0 | −4 | 0 0 1 0 | 2 |
| 1 0 1 1 | −5 | 0 1 0 0 | 4 |
| 1 0 1 0 | −6 | 0 1 1 0 | 6 |
| 1 0 0 1 | −7 | 1 0 0 0 | 8 |
| 1 0 0 0 | −8 | 1 1 0 0 | 12 |

FIG.18

| SUBTRACTION RESULT X | | BRANCHMETRIC VALUE Y | |
|---|---|---|---|
| BINARY (2sc) $X_4\ X_3\ X_2\ X_1\ X_0$ | DECIMAL | BINARY (SB) $Y_3\ Y_2\ Y_1\ Y_0$ | DECIMAL |
| 0 1 1 1 1 | 15 | 1 0 1 0 | 10 |
| 0 1 1 1 0 | 14 | 1 0 1 0 | 10 |
| 0 1 1 0 1 | 13 | 1 0 1 0 | 10 |
| 0 1 1 0 0 | 12 | 1 0 1 0 | 10 |
| 0 1 0 1 1 | 11 | 1 0 1 0 | 10 |
| 0 1 0 1 0 | 10 | 1 0 1 0 | 10 |
| 0 1 0 0 1 | 9 | 1 0 1 0 | 10 |
| 0 1 0 0 0 | 8 | 1 0 1 0 | 10 |
| 0 0 1 1 1 | 7 | 1 0 1 0 | 10 |
| 0 0 1 1 0 | 6 | 1 0 0 0 | 8 |
| 0 0 1 0 1 | 5 | 0 1 1 0 | 6 |
| 0 0 1 0 0 | 4 | 0 1 0 0 | 4 |
| 0 0 0 1 1 | 3 | 0 0 1 1 | 3 |
| 0 0 0 1 0 | 2 | 0 0 1 0 | 2 |
| 0 0 0 0 1 | 1 | 0 0 0 1 | 1 |
| 0 0 0 0 0 | 0 | 0 0 0 0 | 0 |
| 1 1 1 1 1 | −1 | 0 0 0 0 | 0 |
| 1 1 1 1 0 | −2 | 0 0 0 1 | 1 |
| 1 1 1 0 1 | −3 | 0 0 1 0 | 2 |
| 1 1 1 0 0 | −4 | 0 0 1 1 | 3 |
| 1 1 0 1 1 | −5 | 0 1 0 0 | 4 |
| 1 1 0 1 0 | −6 | 0 1 1 0 | 6 |
| 1 1 0 0 1 | −7 | 1 0 0 0 | 8 |
| 1 1 0 0 0 | −8 | 1 0 1 0 | 10 |
| 1 0 1 1 1 | −9 | 1 0 1 0 | 10 |
| 1 0 1 1 0 | −10 | 1 0 1 0 | 10 |
| 1 0 1 0 1 | −11 | 1 0 1 0 | 10 |
| 1 0 1 0 0 | −12 | 1 0 1 0 | 10 |
| 1 0 0 1 1 | −13 | 1 0 1 0 | 10 |
| 1 0 0 1 0 | −14 | 1 0 1 0 | 10 |
| 1 0 0 0 1 | −15 | 1 0 1 0 | 10 |
| 1 0 0 0 0 | −16 | 1 0 1 0 | 10 |

BRANCHMETRIC CALCULATION CIRCUIT IN A VITERBI DECODER

BACKGROUND OF THE INVENTION

1. Field of the Invention

The present invention relates to a Viterbi decoder for decoding digital data signals in a data transmission system, in a recorded information reproducing apparatus for reproducing information recorded on a recording medium, or the like, and more particularly, to a branchmetric calculation circuit in such a Viterbi decoder.

2. Description of Background Information

Viterbi decoding is a method for decoding digital data signals affected by inter-code interference, with a high reliability in a recorded data reproducing system such as a recorded information reproducing apparatus as mentioned above. According to the Viterbi decoding, digital data signals can be decoded in a low error ratio even if inter-code interference is large or even if reproduced signals present a low signal-to-noise (S/N) ratio.

FIG. 1 shows a configuration of a Viterbi decoder for realizing the Viterbi decoding as mentioned above. Referring specifically to FIG. 1, signals read from a recording medium on which digital signals are recorded or information signals transmitted from a communication terminal in a digital transmission system are supplied to an analog-to-digital (A/D) convertor 1 as received signals. The A/D convertor 1 samples the received signals at predetermined sampling timing to sequentially convert the received signals to a sample value sequence which is then supplied to a branchmetric calculation circuit 2.

The branchmetric calculation circuit 2 calculates a square error value between each of a plurality of predicted sample values assumed as possible ideal values for the received sample values (values received when the received signals are not affected by noise or the like) and corresponding one of actually received sample values supplied from the A/D convertor 1, as given by the following equation.

$$\{(\text{received sample value})-(\text{predicted sample value})\}^2 \qquad (1)$$

The square error values are supplied to the pathmetric calculation circuit 3 as branchmetric values.

FIG. 2 shows an example of an internal configuration of the branchmetric calculation circuit 2.

Referring specifically to FIG. 2, a subtractor 21 subtracts a predicted sample value from a received sample value supplied from the A/D convertor 1, and supplies the subtraction result to a multiplier 22. The multiplier 22 squares the supplied subtraction result to derive the square value as a branchmetric value.

Here, assuming that a transmission system up to the supply of the received signals to the Viterbi decoder is a RP(1, 1) transmission system (partial response transmission class I), a received sample value Y(k) at time k can be predicted from a transmitted sample value X(k) at time k and a transmitted sample value X(K-1) at the preceding time. More specifically, when X(k) and X(K-1) are "0, 0", Y(k) is "0". When X(k) and X(K-1) are "0, 1" or "1, 0", Y(k) is "1". When X(k) and X(K-1) are "1, 1", Y(k) is "2". Stated another way, a received sample value Y(k) supplied to the Viterbi decoder can be predicted in four different ways in accordance with the two transmitted sample values X(k) and X(K-1).

In this event, the branchmetric calculation circuit 2 supplies a pathmetric calculation circuit 3 with four branchmetric values $\lambda_{00}$–$\lambda_{11}$ corresponding to these four predicted sample values.

The pathmetric calculation circuit 3 accumulatively adds the values in sequence for each branchmetric value, and utilizes the accumulatively added values as pathmetric values. Then, a pass selecting signal indicative of the pass having the smallest one of these pathmetric values is supplied to a pass memory 4. The pass memory 4, in response to the pass selecting signal, updates a preliminarily determined value consisting of "0" and "1" values, and outputs this as a decoded digital signal.

As described above, the Viterbi decoder calculates a square error between a received sample value and a predicted sample value as a branchmetric, and relies on the branchmetric to decode a seemingly reliable digital signal sequence.

However, for deriving the square error, square calculation processing using the multiplier 22 shown in FIG. 2 is indispensable. The multiplier 22 requires a long time for the calculation due to a delay caused by carry operations performed within the multiplier 22. Thus, the processing time required by the entire Viterbi decoding also becomes longer depending on the time spent for the square calculation. Further, since the multiplier 22 has a large circuit scale, if the Viterbi decoder as shown in FIG. 1 is integrated in a single LSI circuit, its manufacturing cost will be increased.

OBJECTS AND SUMMARY OF THE PRESENT INVENTION

The present invention has been made to solve the problems mentioned above, and its object is to provide a branchmetric calculation circuit in a Viterbi decoder which is capable of performing high speed decoding in a small circuit scale. The present invention provides a branchmetric calculation circuit in a Viterbi decoder which calculates a square error between a received value and a predicted value as a branchmetric and produces a decoded data sequence based on the branchmetric, comprising subtracting means for subtracting the predicted value from the received value to derive a subtraction value, and broken line converting means for converting the subtraction value using a broken line function for square calculation and utilizing the resulting value as the branchmetric.

The branchmetric calculation circuit in a Viterbi decoder according to the present invention performs the square calculation for deriving a square of a subtraction result value between a received sample value and a predicted sample value using broken line approximation given by a plurality of linear functions.

BRIEF DESCRIPTION OF THE DRAWINGS

FIG. 8 is shows a truth table for the branchmetric calculation circuit illustrated in FIG. 7;

FIG. 13 shows a truth table for the branchmetric calculation circuit illustrated in FIG. 12;

FIG. 18 shows a truth table for the branchmetric calculation circuit illustrated in FIG. 17.

DETAILED DESCRIPTION OF THE PREFERRED EMBODIMENTS

The present invention will hereinafter be described in connection with several embodiments thereof.

Figure 3:
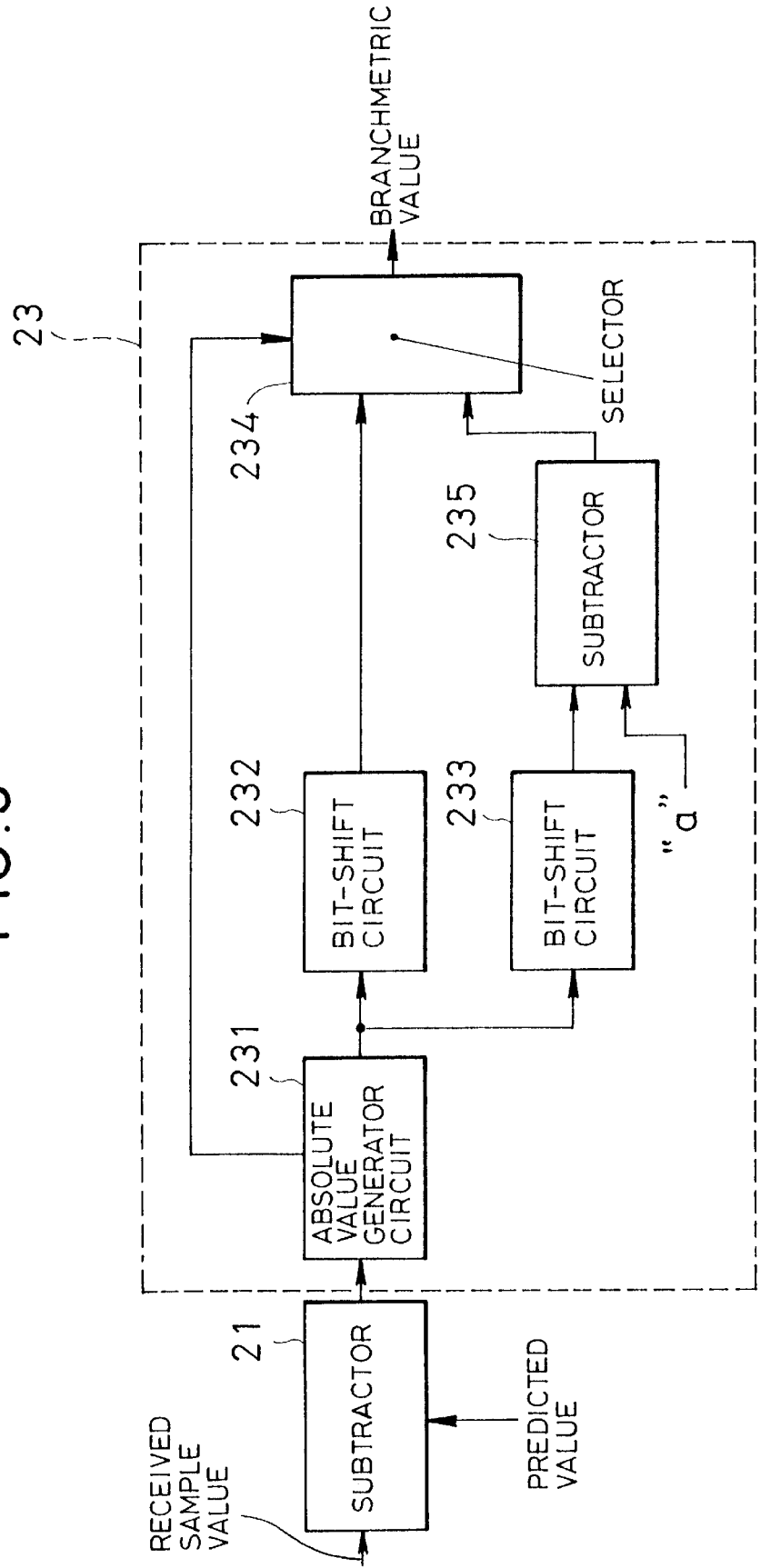
FIG. 3 is a block diagram showing a configuration of a branchmetric calculation circuit according to the present invention.

FIG. 3 shows a configuration of a branchmetric calculation circuit according to the present invention.

Figure 1:
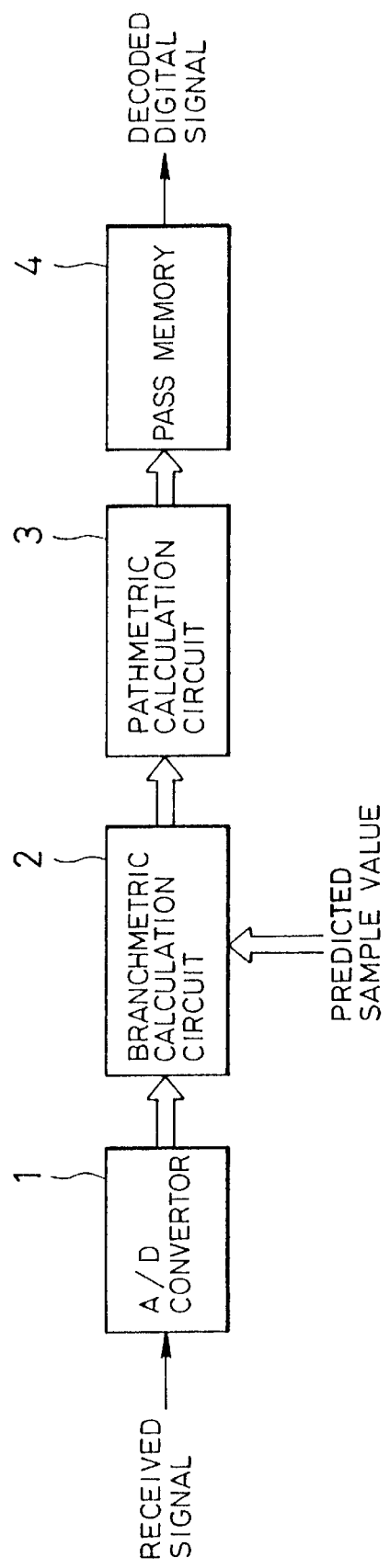
FIG. 1 is a block diagram showing a configuration of a Viterbi decoder.
Figure 2:
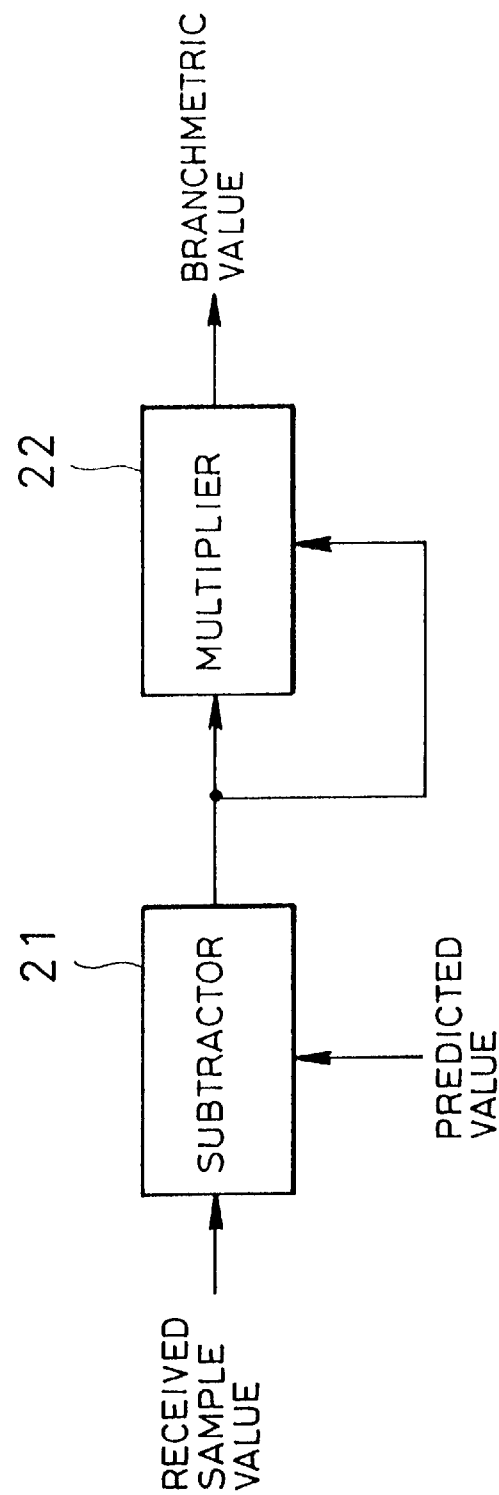
FIG. 2 is a block diagram showing a configuration of a conventional branchmetric calculation circuit.

In FIG. 3, a subtractor 21 subtracts a predicted sample value from a received sample value supplied from the A/D convertor 1 shown in FIG. 1, and supplies the subtraction result value to a broken-line convertor circuit 23.

The broken line convertor circuit 23 converts the subtraction result value using a broken-line approximation function for square calculation to derive a converted value as a branchmetric value. In this event, assuming that the subtraction result value is X, the broken-line approximation function is given by the following linear functions Ya and Yb:

$$Ya=2^i \cdot |X|, \text{ where } |X|<t$$

$$Yb=2^j \cdot |X|-a \text{ where } |X| \geq t$$

In the broken-line convertor circuit 23 shown in FIG. 3, an absolute value $|X|$ of the subtraction result value X is calculated by an absolute value generator circuit 231, and this absolute value $|X|$ is bit-shifted by i bits by a bit-shift circuit 23 to realize the linear function Ya. On the other hand, a subtractor 235 subtracts a predetermined constant a from a value derived by bit-shifting the absolute value $|X|$ by j bits by a bit-shift circuit 233 to realize the linear function Yb.

In this event, a selector 234 selects the value bit-shifted by the bit-shift circuit 232 as described above as a branchmetric value when the absolute value $|X|$ is smaller than a predetermined value t, and selects the value calculated by subtracting the predetermined constant a from the bit-shifted value by the bit-shift circuit 233 as the branchmetric value when the absolute value $|X|$ is equal to or lager than the predetermined value t.

Figure 4:
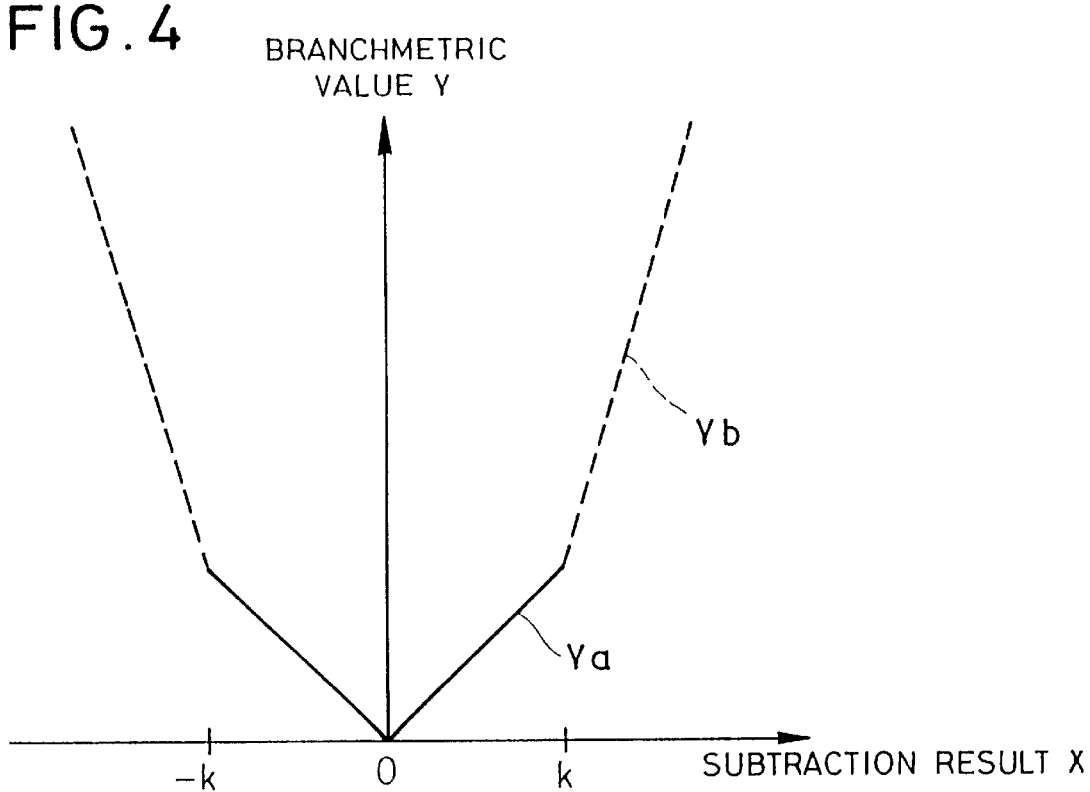
FIGS. 4–6 are graphs each showing an example of a broken line approximation function for a square calculation performed by the branchmetric calculation circuit of the present invention.

FIG. 4 shows a broken line approximation function for the square calculation performed by the broken line convertor circuit 23.

As shown in FIG. 4, when the absolute value of the subtraction result value X is smaller than the predetermined value t, the linear function Ya (indicated by a solid line), the gradient of which is $2^i$, is utilized to convert the subtraction result value X, and the converted value is used as a branchmetric value Y. On the other hand, when the absolute value of the subtraction result value X is equal to or lager than the predetermined value t, the linear function (indicated by a broken line), the gradient of which is $2^j$, is used to convert the subtraction result value X, and the converted value is used as the branchmetric value Y.

Figure 5:
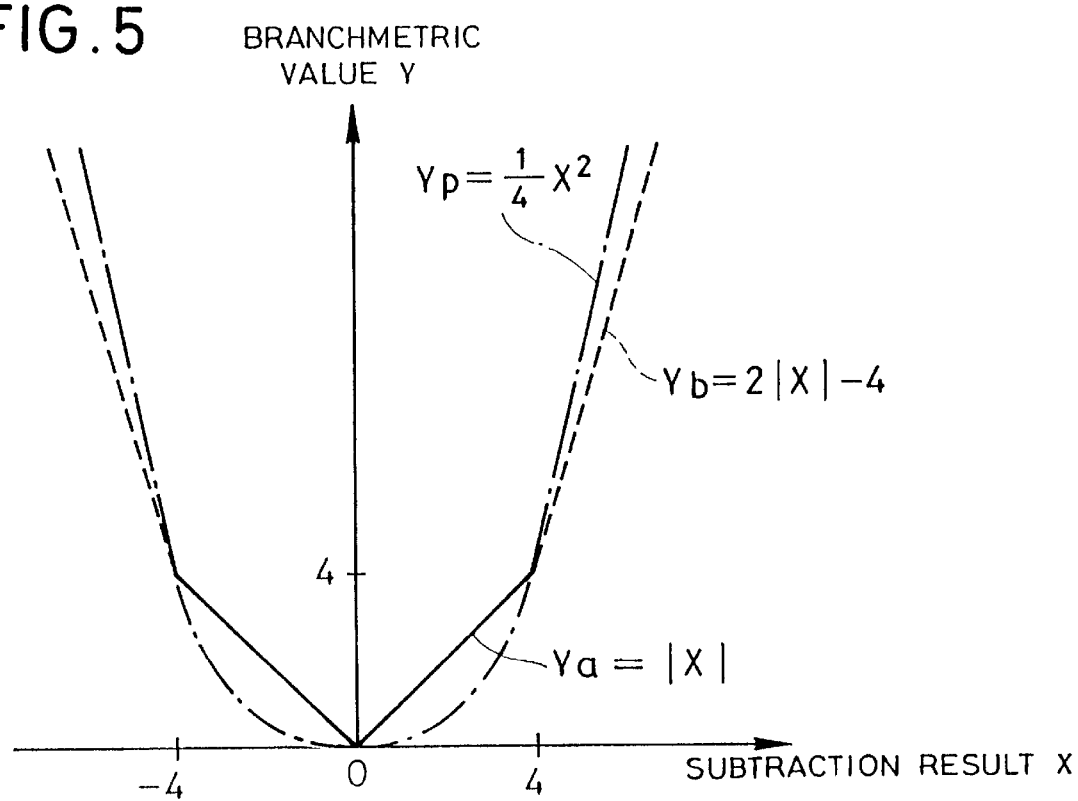

FIG. 5 shows an example of a broken-line approximation function which is applied when the square calculation is performed as $Y_p=(¼) \cdot X^2$.

In FIG. 5, the subtraction result value X is an integer value expressed by 4 bits (−8−7), and the shown broken-line approximation function is one derived when i=0 in the linear function Ya, j=1 in the linear function Yb, a=4, and t is equal to one half of a maximum value of the absolute value $|X|$, i.e., 4.

Thus, the broken-line approximation function is given by:

$$Ya=|X|, \text{ where } |X|<4$$

$$Yb=2 \cdot |X|-4, \text{ where } |X| \geq 4$$

In this event, the absolute value generator circuit 23 shown in FIG. 3 supplies the subtraction result value X as it is to each of the bit-shift circuits 232 and 233 when the 4-bit subtraction result value X supplied from the subtractor 21 has its most significant bit set to logical "0", i.e., when the subtraction result value X is a positive integer equal to or less than 7. On the other hand, if the most significant bit of the subtraction result value X is logical "1", i.e., if the subtraction result value X is a negative integer equal to or more than −8, the absolute value generator circuit 23 inverts the logical states of all 4 bits of the subtraction result value X, adds 1 to the inverted value, and supplies the resulting value as the absolute value $|X|$ to each of the bit-shift circuits 232 and 233. Here, since i=0 is assumed in the bit-shift circuit 232, as mentioned above, the bit-shift circuit 232 supplies the absolute value $|X|$ as it is to the selector 234 without performing the bit shifting. On the other hand, the bit-shift circuit 233 supplies the subtractor 235 with a value derived by bit-shifting the absolute value $|X|$ by 1 bit toward the most significant bit. The subtractor 235 supplies the selector 234 with a value subtracted 4 from this value. The selector 234 selects the value bit-shifted in the bit-shift circuit 232 in the foregoing manner as the branchmetric value when the absolute value $|X|$ is smaller than 4. On the other hand, the selector 234 selects the value derived by subtracting the predetermined constant a from the bit-shifted value in the bit-shift circuit 283 as the branchmetric value when the absolute value $|X|$ is equal to or larger than 4.

As described above, in view of the operation of the Viterbi decoding which performs decoding of a seemingly reliable data sequence by selecting a sequence which has the smallest accumulated sum of branchmetric values, the present invention realizes the square calculation performed by the branchmetric calculation circuit using the broken-line approximation given by a plurality of linear functions. Stated another way, in the Viterbi decoding, the value of branchmetric itself is not important, but what is important is to determine which of branchmetric values derived corresponding to a plurality of decoded sequences presents the smallest value. In other words, what is required is only relative comparison among respective branchmetric values, so that decoding accuracy will not be degraded even if the broken-line approximation given by a plurality of linear functions is applied to derive branchmetric values without using the square calculation for the branchmetric values.

Thus, the present invention enables the operation for deriving the branchmetric values to be faster than the conventional branchmetric calculation circuit which uses a multiplier for the square calculation for deriving branchmetric values.

It should be noted that while in the embodiment shown in FIG. 5, the converting functions for the subtraction result value X in the range of positive integer values and the converting functions for the subtraction result value X in the range of negative integer values are symmetric to the ordinate axis, the converting functions may be asymmetric.

Figure 6:
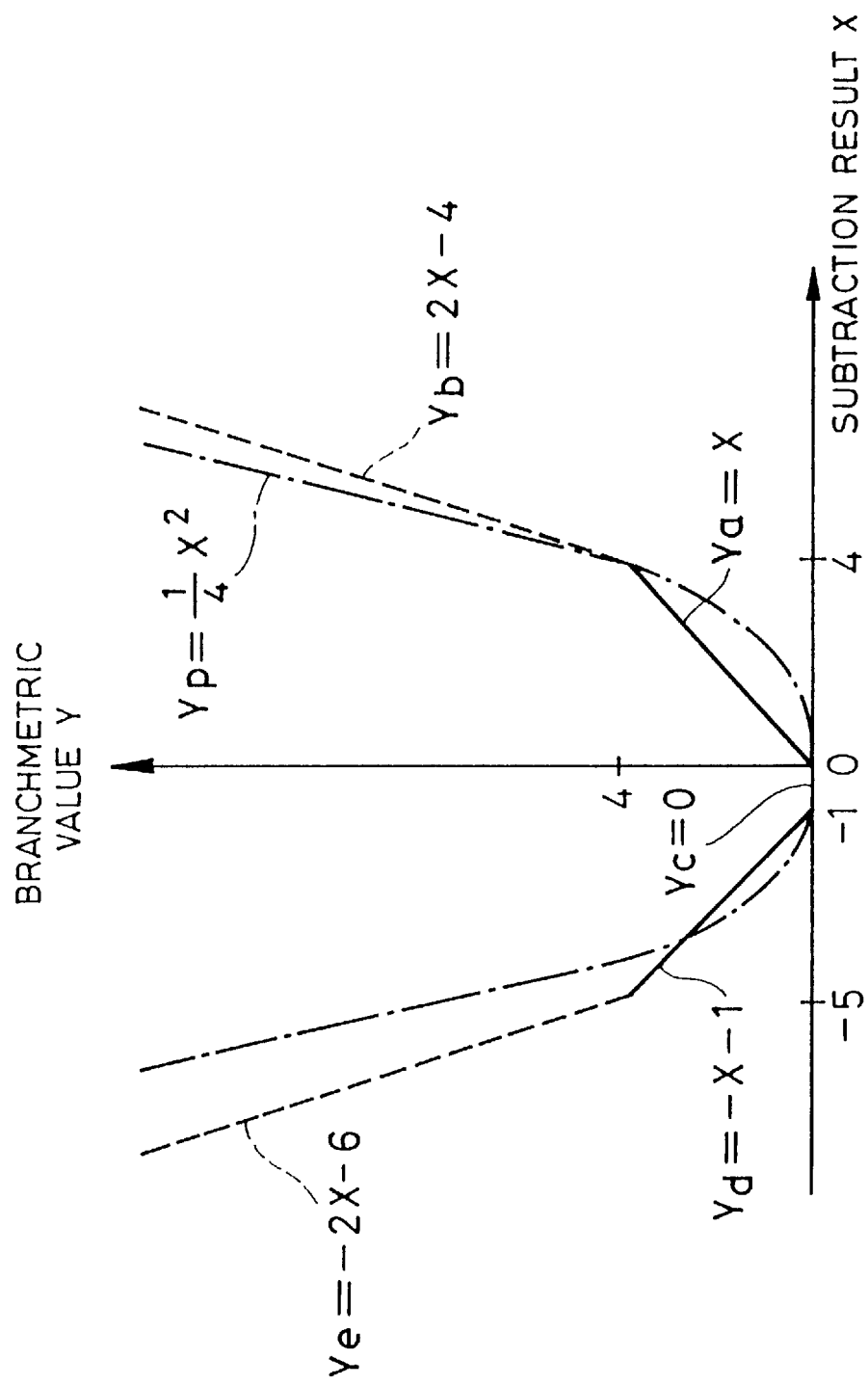
Figure 7:
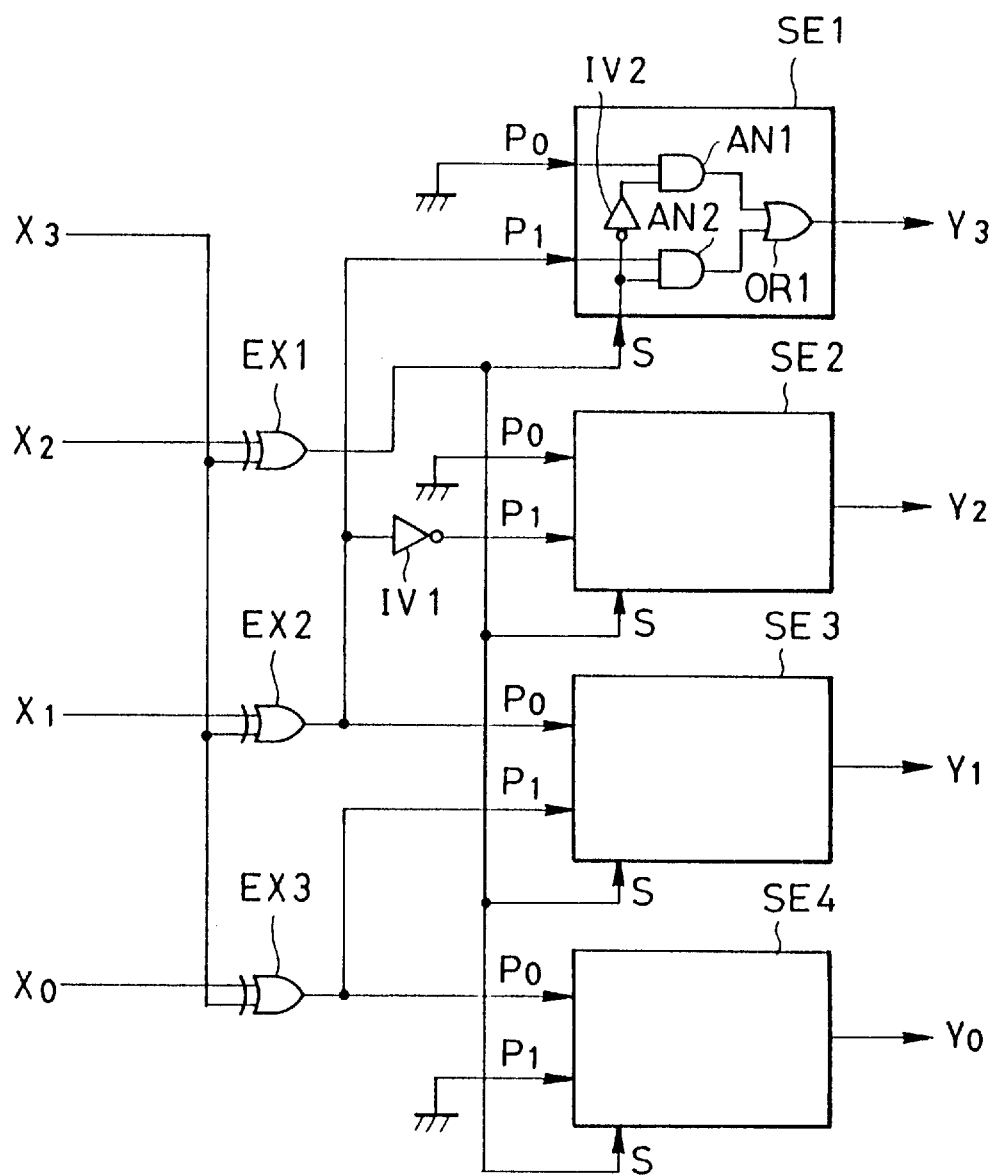
FIG. 7 is a diagram showing a circuit configuration of the branchmetric calculation circuit according to the present invention.

FIG. 6 shows another example of a broken-line approximation function created in view of the above-mentioned aspect. The broken-line approximation function shown in FIG. 6 is composed of five linear functions Ya–Ye as follows:

$Ya=X$, where $0 \leq X < 4$ $Yb=2 \cdot X - 4$, where $4 \leq X$ $Yc=0$, where $-1 \leq X < 0$ $Yd=-X-1$, where $-5 \leq X < -1$ $Ye=-2 \cdot -X - 6$, where $X < -5$ FIG. 7 shows an example of a circuit configuration of a broken-line convertor circuit 23 which derives branchmetric values using the five linear functions Ya–Ye.

Referring specifically to FIG. 7, each bits $X_0$–$X_3$ in a subtraction result value X supplied from the subtractor 21 shown in FIG. 3 are input to exclusive OR circuits EX1–EX3. The exclusive OR circuit EX1 takes exclusive OR of bits $X_2$ and $X_3$ in the subtraction result value X, and supplies the exclusive OR output to a selection terminal S of each of selectors SE1–SE4. The exclusive OR circuit EX2 takes exclusive OR of bits $X_1$ and $X_3$ in the subtraction result value X, and supplies the exclusive OR output to each of an input terminal $P_1$ of the selector SE1, an input terminal $P_0$ of the selector SE3, and an invertor IV1. The invertor IV1 inverts a logical value of the exclusive OR output supplied from the exclusive OR circuit EX2, and supplies the inverted logical value to an input terminal $P_1$ of the selector SE2. The exclusive OR circuit EX3 takes exclusive OR of bits $X_0$ and $X_3$ in the subtraction result value X, and supplies the exclusive OR output to each of an input terminal $P_1$ of the selector SE3 and an input terminal $P_0$ of the selector SE4.

The selectors SE1–SE4 are 2-to-1 selectors each composed of an invertor IV2, AND gates AN1 and AN2, and an OR gate OR1. When the selectors SE1–SE4 are supplied at their respective selection terminals S with a logical value "0", they select the signals supplied to their input terminals $P_0$ as branchmetric values $Y_0$–$Y_3$, respectively. On the other hand, when a logical value "1" is supplied to the selection terminals S of the selectors, they select the signals supplied to their input terminals $P_1$ as the branchmetric values $Y_0$–$Y_3$, respectively.

As described above, the broken-line approximation function shown in FIG. 6 can be implemented by a relatively small scale logical circuit as shown in FIG. 7.

It should be noted that the foregoing embodiments realizes the broken-line approximation for the square calculation using a two-step broken line, the present invention is not limited to this particular configuration using the two-step broken line.

Figure 9:
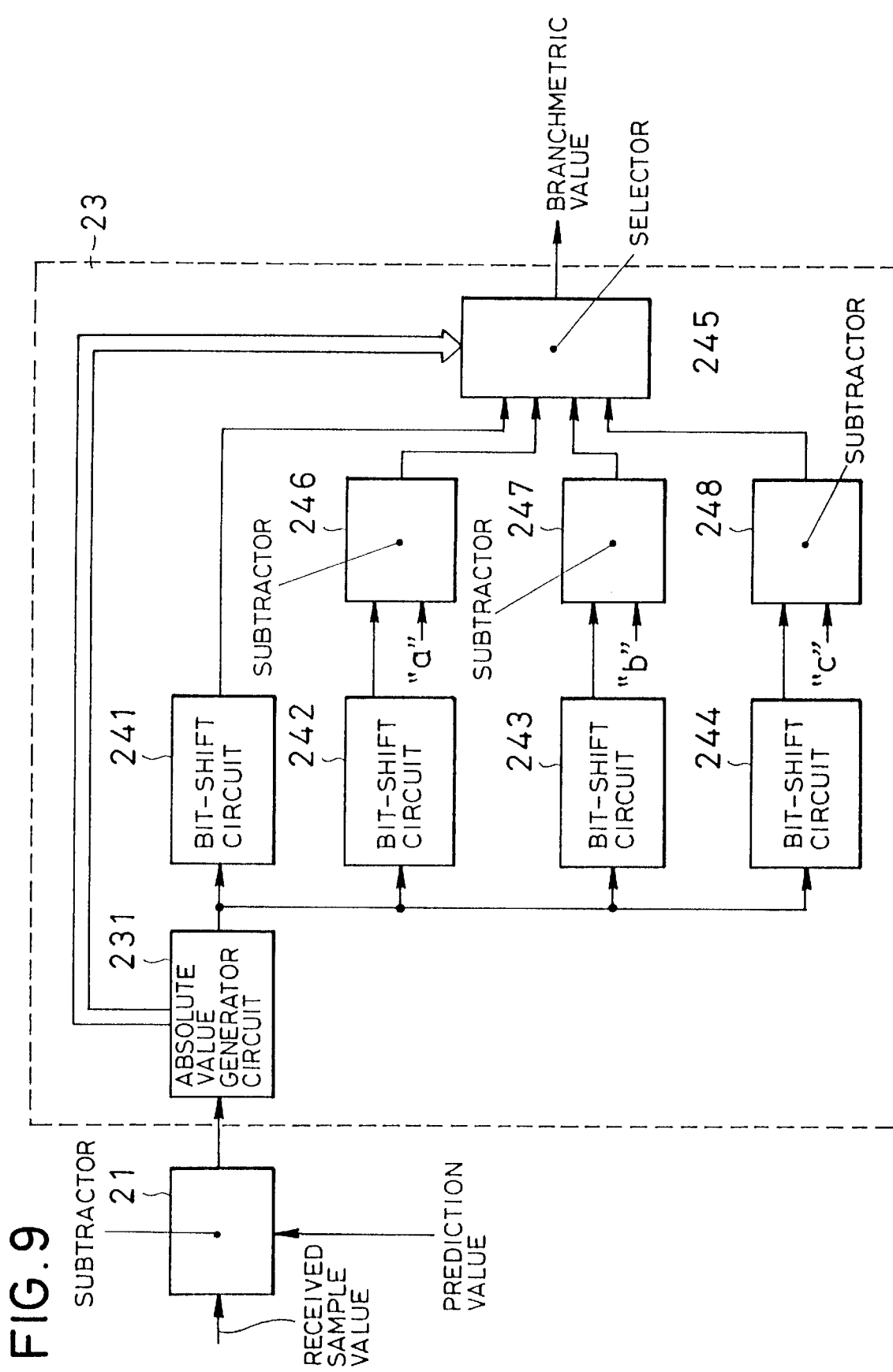
FIG. 9 is a block diagram showing another configuration of a branchmetric calculation circuit according to the present invention.

FIG. 9 shows a configuration of a branchmetric calculation circuit including a broken-line convertor circuit 23 which performs the broken-line approximation for the square calculation using a four-step broken line.

Referring specifically to FIG. 9, a subtractor 21 subtracts a predicted sample value from a received sample value supplied from the A/D convertor 1 in FIG. 1, and supplies this subtraction result value to the broken line convertor circuit 23.

The broken-line convertor circuit 23 converts the subtraction result value using the broken line approximation function for the square calculation and derives a converted value as a branchmetric value. In this event, the used broken line approximation function is given by the following linear functions Ya–Yd:

$Ya = 2^i \cdot |X|$, where $|X| < t_1$ $Yb = 2^j \cdot |X| - a$, where $t_1 \leq |X| < t_2$ $Yc = 2^k \cdot |X| - b$, where $t_2 \leq |X| < t_3$ $Yd = 2^1 \cdot |X| - c$, where $t_3 \leq |X|$ In the broken line convertor circuit 23 shown in FIG. 9, an absolute value $|X|$ of the subtraction result value X is generated in an absolute value generator circuit 231. Then, this absolute value $|X|$ is bit-shifted by i bits in a bit-shift circuit 241 to realize the linear function Ya. Also, from a value derived by bit-shifting the absolute value $|X|$ by j bits in a bit-shift circuit 242, a predetermined constant a is subtracted in a subtractor 246 to realize the linear function Yb. Further, from a value derived by bit-shifting the absolute value by k bits in the bit-shift circuit 243, a predetermined value b is subtracted in the subtractor 247 to realize the linear function Yc. Furthermore, from a value derived by bit-shifting the absolute value $|X|$ by 1 bits in a bit-shift circuit 244, a predetermined value c is subtracted in a subtractor 248 to realize the linear function Yd.

In this event, a selector 245 selects the value derived by the bit-shift operation in the bit-shift circuit 241 as a branchmetric value when the absolute value $|X|$ is smaller than $t_1$. Also, the selector selects the value derived by subtracting the predetermined constant a from the value bit-shifted in the bit-shift circuit 242 as a branchmetric value when the absolute value $|X|$ is equal to or more than t1 and less than $t_2$. Further, the selector 245 selects the value derived by subtracting the predetermined constant b from the value bit-shifted in the bit-shift circuit 243 as a branchmetric value when the absolute value $|X|$ is equal to or more than $t_2$ and less than $t_3$. Furthermore, the selector 245 selects the value derived by subtracting the predetermined constant c from the value bit-shifted in the bit-shift circuit 244 as a branchmetric value when the absolute value $|X|$ is larger than $t_3$.

Figure 10:
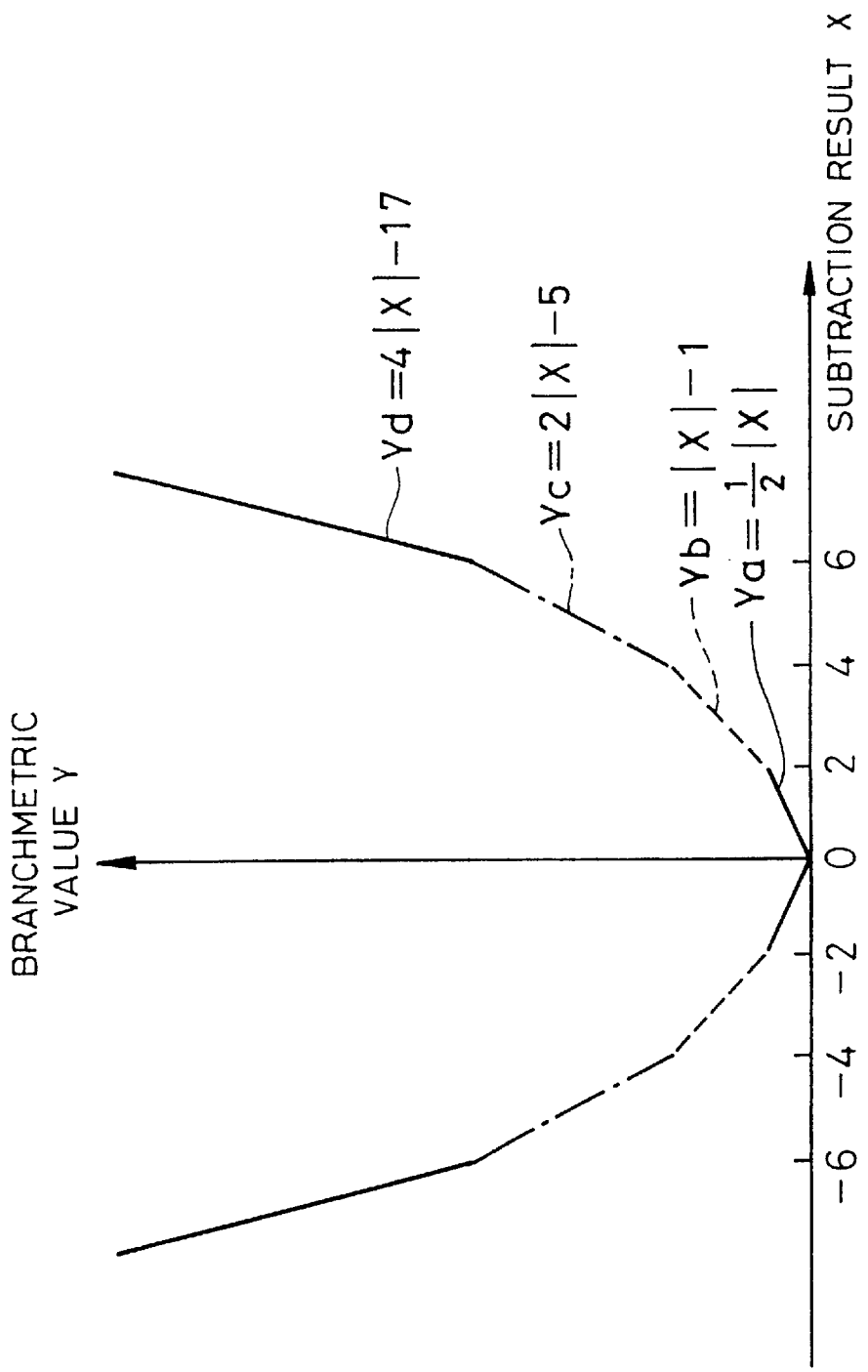
FIGS. 10 and 11 are graphs each showing an example of the broken line approximation function for the square calculation performed by the branchmetric calculation circuit of the present invention.
Figure 11:
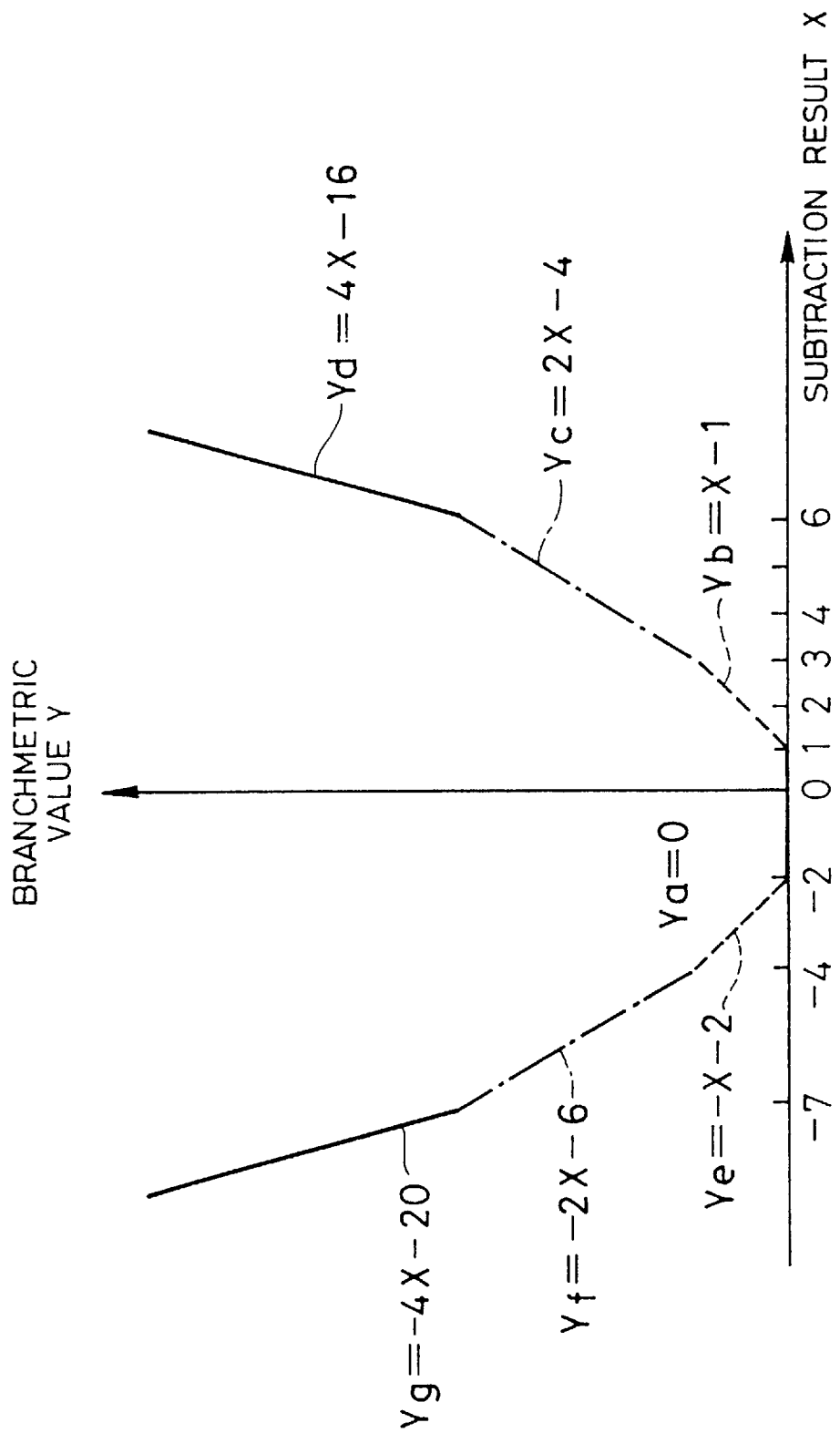

FIG. 10 shows a broken line approximation function when the above-mentioned $t_1$ is chosen to be 2 which is a quarter of the maximum value of the absolute value $|X|$; $t_2$, 4 which is a half of the maximum value of the absolute value $|X|$; and $t_3$, 6 which is three quarters of the maximum value of the absolute value $|X|$, in addition to i=−1, j=0, k=1, l=2, a=1, b=5, and c=17. In this event, the broken line approximation function is given by the following equations:

$Ya = (\frac{1}{2}) \cdot |X|$, where $|X| < 2$ $Yb = |X| - 1$, where $2 < |X| < 4$ $Yc=2\cdot|X|-5$, where $4\leq|X|<6$ $Yd=4\cdot|X|-17$, where $6\leq|X|$ Further, FIG. 11 shows an example of a broken line approximation function for performing broken line approximation for the square calculation using a seven-step broken line.

Figure 12:
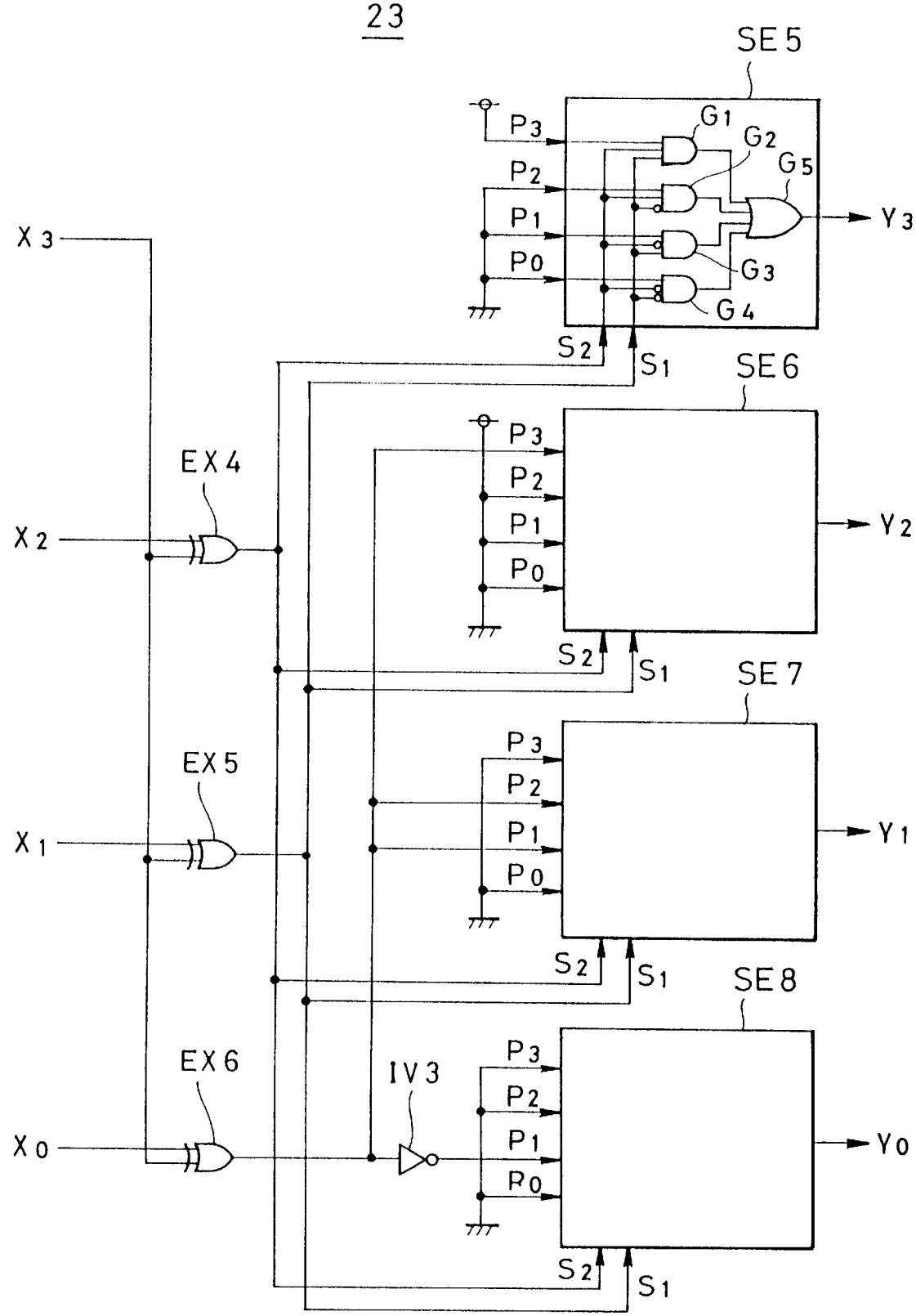
FIG. 12 is a diagram showing an example of a circuit configuration of a branchmetric calculation circuit according to the present invention.

The broken-line approximation function shown in FIG. 11 is composed of seven linear functions Ya–Yg as follows:

$Ya=0$, where $-2<X\leq1$ $Yb=X-1$, where $1<X\leq3$ $Yc=2\cdot X-4$, where $3\leq X<6$ $Yd=4\cdot X-16$, where $6\leq X$ $Ye=-X-2$, where $-4<X\leq-2$ $Yf=-2\cdot X-6$, where $-7<X\leq-4$ $Yg=-4\cdot X-20$, where $X\leq-7$ FIG. 12 shows an example of a circuit configuration of a broken line convertor circuit 28 for deriving branchmetric values using the above seven linear functions Ya–Yg, and FIG. 13 shows a truth table for the circuit illustrated in FIG. 12.

Referring specifically to FIG. 12, each of bits $X_0$–$X_3$ in a subtraction result value X supplied from the subtractor 21 shown in FIG. 9 is supplied to exclusive OR circuits EX4–EX6. The exclusive OR circuit EX4 takes exclusive OR of bits $X_2$ and $X_3$ in the subtraction result value X, and supplies the exclusive OR output to a selection terminal S2 of respective selectors SE5–SE8. The exclusive OR circuit EX5 takes exclusive OR of bits $X_1$ and $X_3$ in the subtraction result value X, and supplies the exclusive OR output to a selection terminal S1 of the respective selectors SE5–SE8. The exclusive OR circuit EX6 takes exclusive OR of bits $X_0$ and $X_3$ of the subtraction result value X, and supplies the exclusive OR output to each of an input terminal $P_3$ of a selector SE6, input terminals $P_1$ and $P_2$ of a selector SE7, and an invertor IV3. The invertor IV3 inverts the logical value of the exclusive OR output supplied from the exclusive OR circuit EX6, and supplies the inverted logical value to an input terminal $P_1$ of a selector SE8.

The selectors SE5–SE8, which are 4-to-1 selectors each composed of gates G1–G5 as illustrated, select signals supplied to their input terminals $P_0$ as branchmetric values $Y_0$–$Y_3$, respectively, when a logical "0" signal is supplied to their respective selection terminals S1 and S2. Also, the selectors SE5–SE8 select signals supplied to their input terminals $P_1$ as the branchmetric values $Y_0$–$Y_3$, respectively, when a logical "1" signal and a logical "0" signal are supplied to their respective selection terminals S1, S2. The selectors SE3–SE8 select signals supplied to their input terminals $P_2$ as the branchmetric values $Y_0$–$Y_3$, respectively, when a logical "0" signal and a logical "1" signal are supplied to their respective selection terminals S1 and S2. The selectors SE3–SE8 select signals supplied to their input terminal $P_3$ as the branchmetric values $Y_0$–$Y_3$, respectively, when a logical "1" signal is supplied to their respective input terminals S1 and S2.

As described above, the broken line approximation function shown in FIG. 11 can be implemented in a relatively small scale logical circuit as shown in FIG. 12.

Also, in the calculation of the branchmetric using the broken line approximation function as mentioned above, a maximum value may be set to calculated branchmetric values. Stated another way, since a branch having a branchmetric larger than a certain value or a pass including this branch is selected with a quite low probability, the decoding performance will not degraded even if a maximum value of the branchmetric value is limited.

Figure 14:
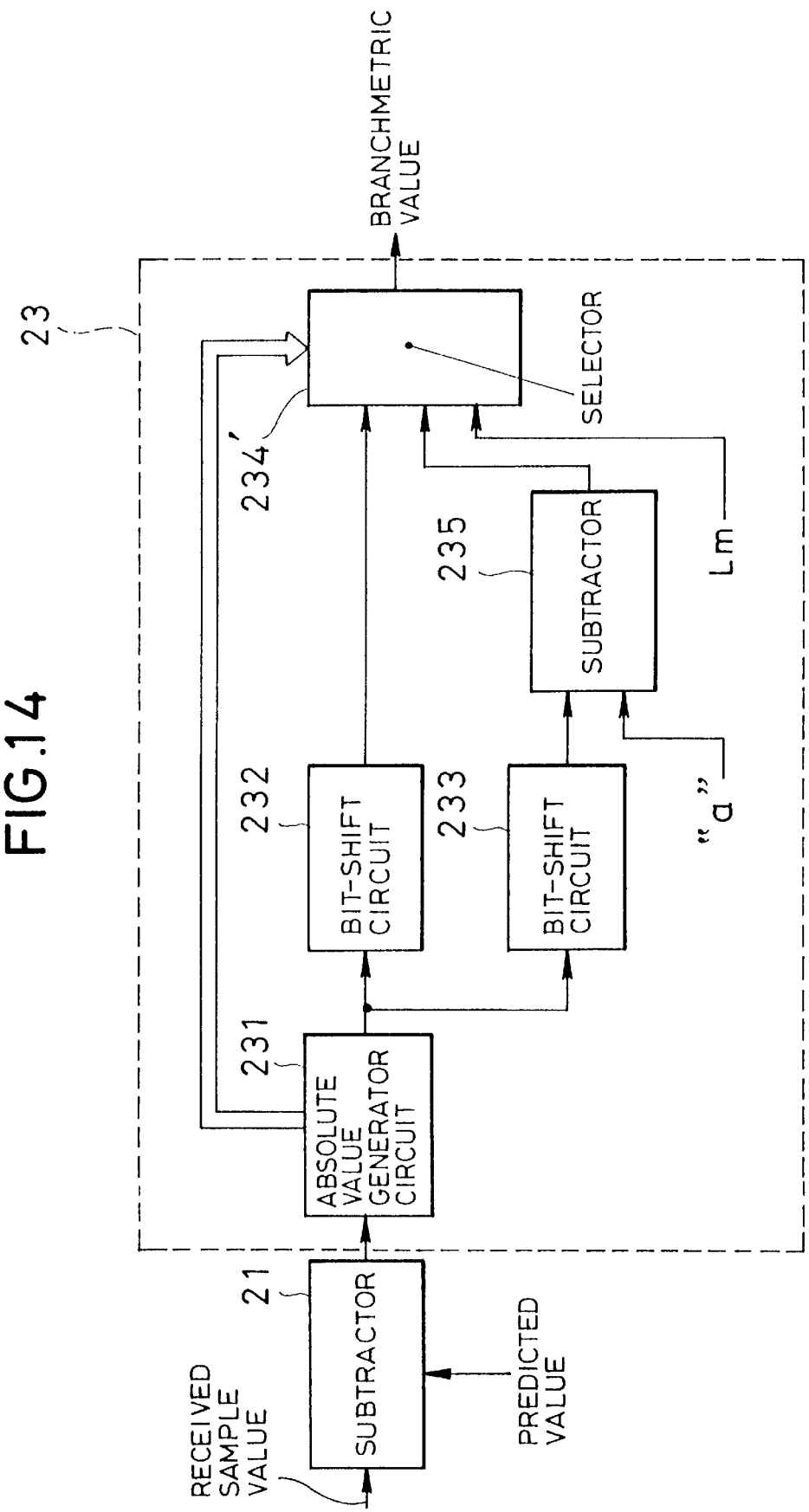
FIG. 14 is a block diagram showing another configuration of a branchmetric calculation circuit according to the present invention.

FIG. 14 shows an example of a configuration in which a so-called limiter function for limiting the maximum branchmetric value to a certain value is added to the branchmetric calculation circuit shown in FIG. 3. In FIG. 14, the functional blocks identical to those in FIG. 3 are designated the same reference numerals.

Figure 15:
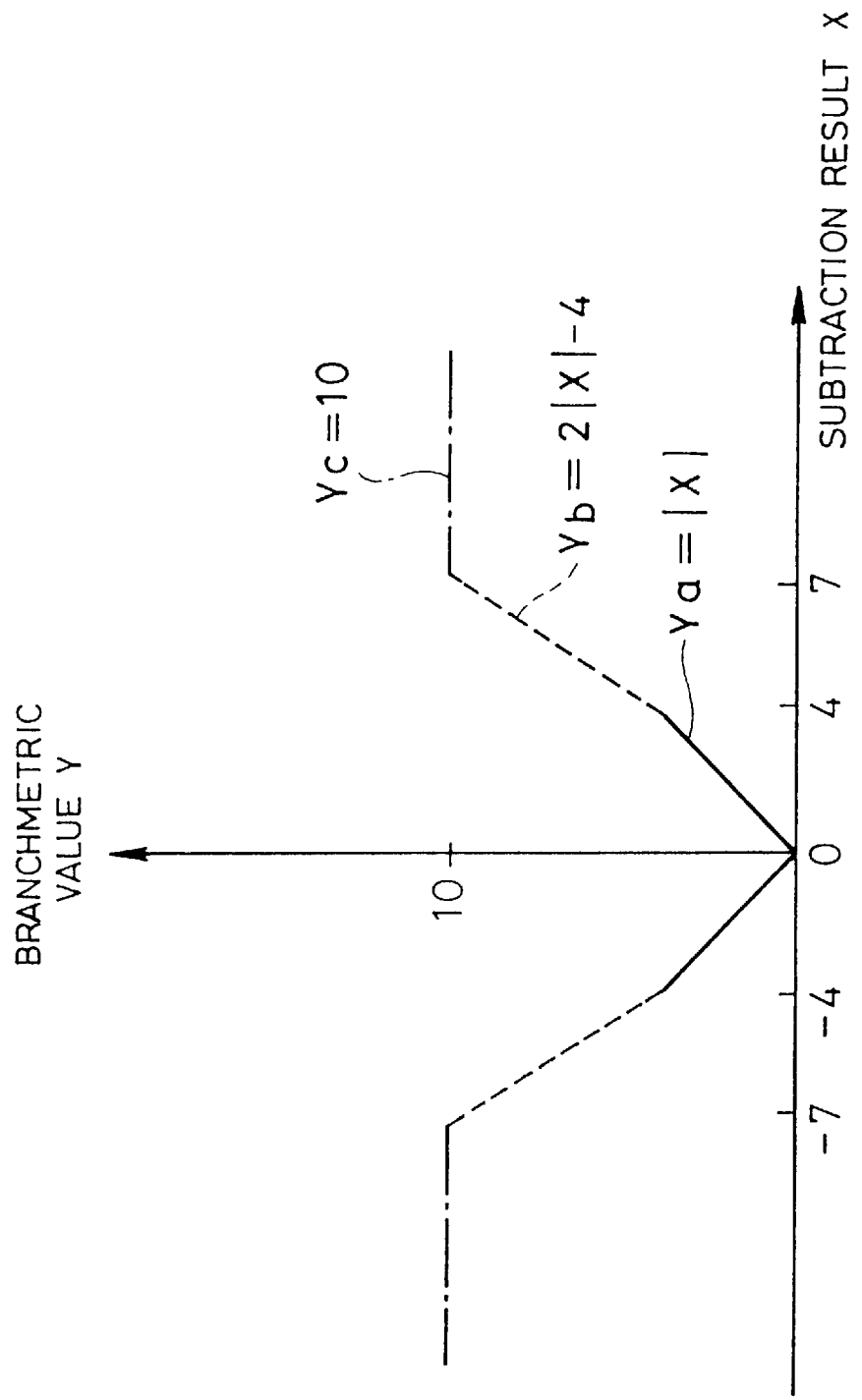
FIGS. 15 and 16 are graphs each showing an example of the broken line approximation function for the square calculation by the branchmetric calculation circuit of the present invention.
Figure 16:
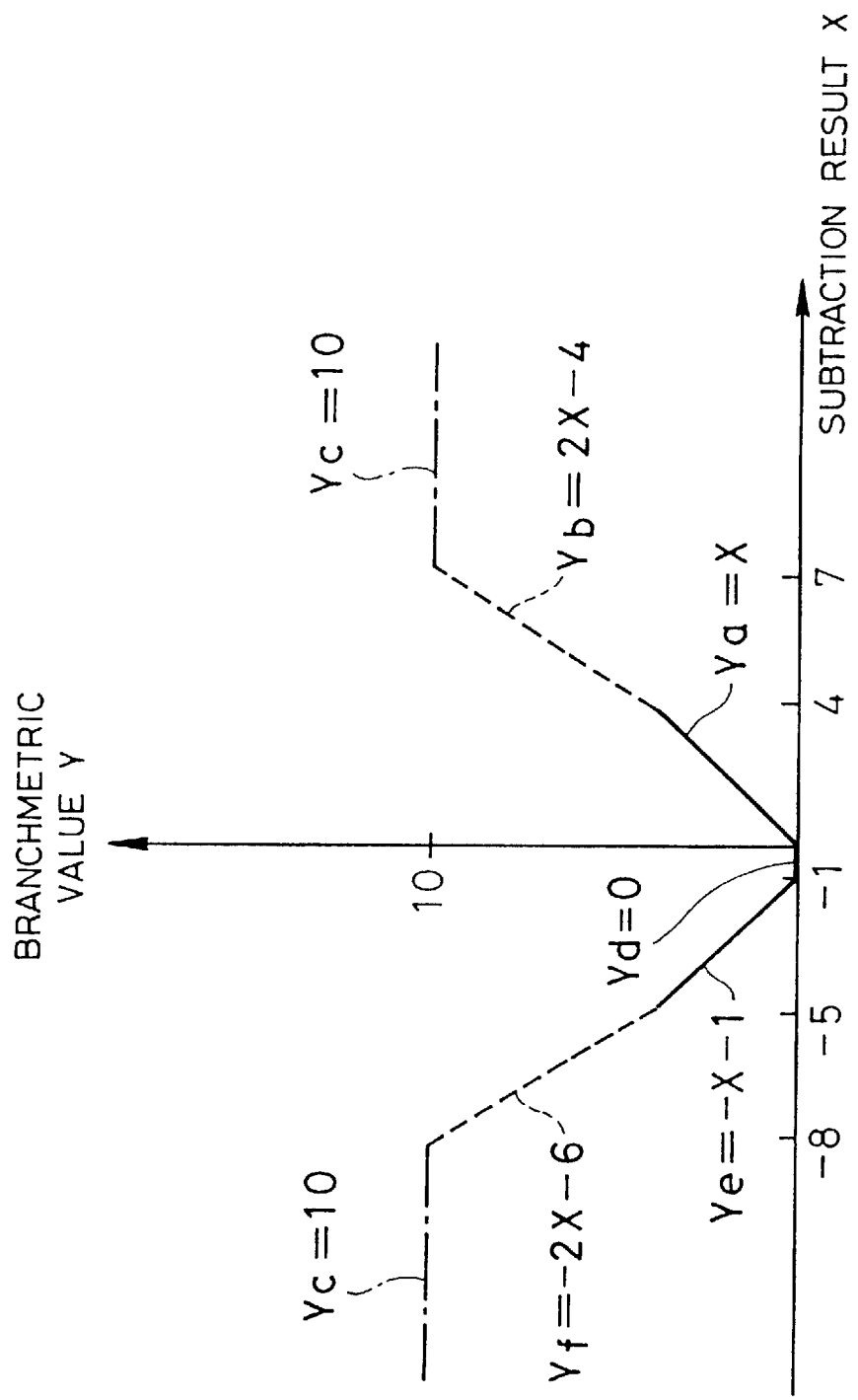
Figure 17:
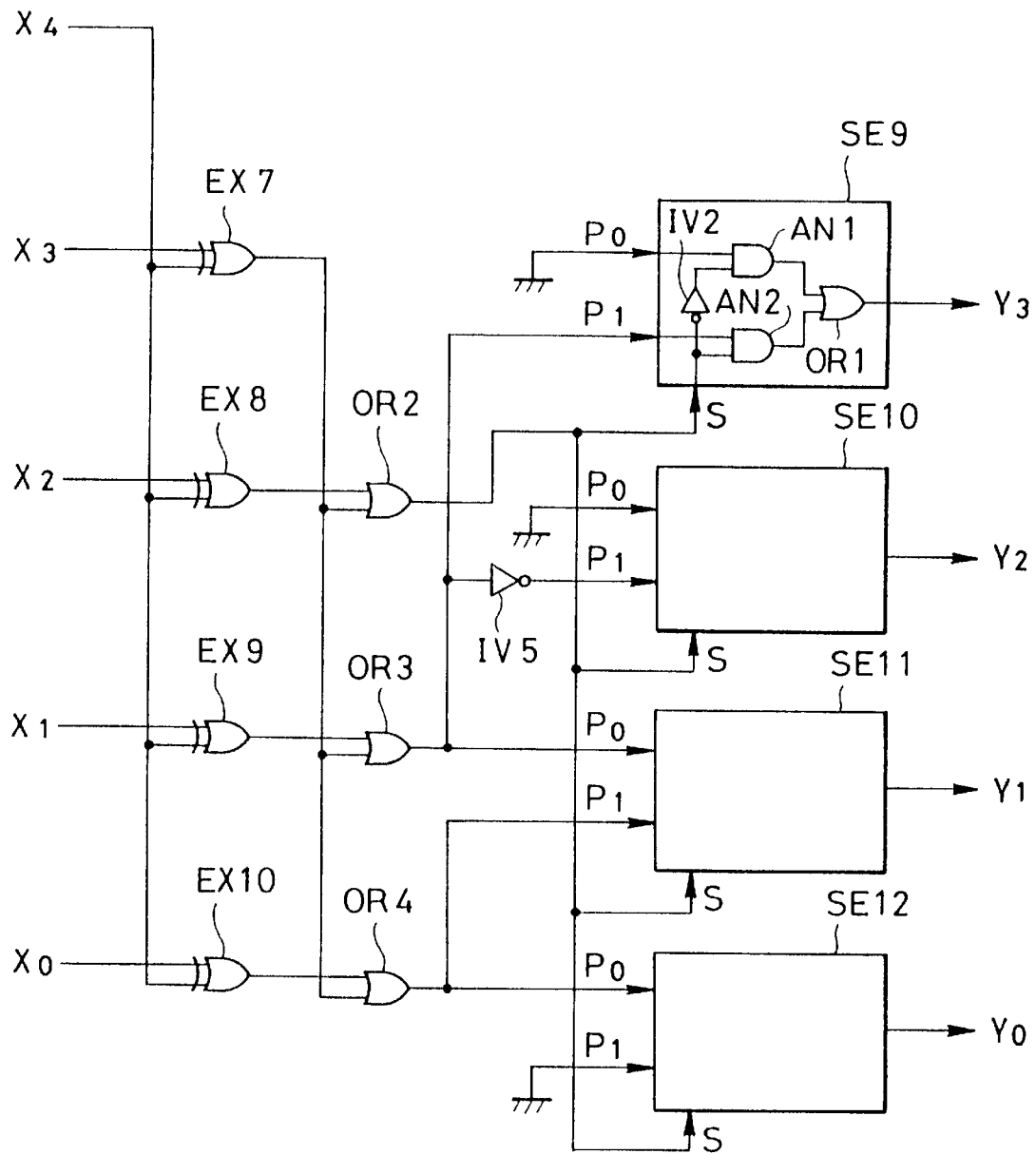
FIG. 17 is a diagram showing a circuit configuration of a branchmetric calculation circuit according to the present invention.

In the configuration shown in FIG. 14, if an absolute value |X| of a subtraction result value X generated in the absolute value generator circuit 231 is larger than a predetermined limit value, a selector 234' outputs a fixed value Lm as a branchmetric value. FIG. 15 shows an example of a broken line approximation function for which an upper limit value is set to 7, a lower limit value to –7 and a fixed value Lm to 10. The broken line approximation function shown in FIG. 15 is given by the following equations:

$Ya=|X|$, where $|X|<4$ $Yb=2\cdot|X|-4$, where $4\leq|X|<7$ $Yc=10$, where $7\leq|X|$ FIG. 16 shows another embodiment of a broken line approximation function for which an upper limit value is set to 7, a lower limit value to –8 and a fixed value Lm to 10. The broken line approximation function shown in FIG. 16 is given by the following equations:

$Ya=X$, where $0\leq X<4$ $Yb=2\cdot X-4$, where $4\leq X<7$ $Yc=10$, where $7\leq X$, or $X<-8$ $Yd=0$, where $-1\leq X<0$ $Ye=-X-1$, where $-5\leq X<-1$ $Yf=-2\cdot X-6$, where $-8\leq X<-5$ FIG. 17 shows an example of a circuit configuration of a broken line convertor circuit 23 for deriving branchmetric values using the above six linear functions Ya–Yf, and FIG. 18 shows a truth table for the circuit illustrated in FIG. 17.

Referring specifically to FIG. 17, a 5-bit subtraction result value X consisting of bits $X_0$–$X_4$ is supplied to exclusive OR circuits EX7–EX10 from the subtractor 21 shown in FIG. 14. The exclusive OR circuit EX7 takes exclusive OR of bits $X_4$ and $X_3$ in the subtraction result value X, and supplies the exclusive OR output to each of OR gates OR2–OR4. The exclusive OR circuit EX8 takes exclusive OR f bits $X_4$ and $X_2$ in the subtraction result value X and supplies the exclusive OR output to the OR gate OR2. The exclusive OR circuit EX9 takes exclusive OR of bits $X_4$ and $X_1$ in the subtraction result value X and supplies the exclusive OR output to the OR gate OR3. The exclusive OR circuit EX10 takes exclusive OR of bits $X_4$ and $X_0$ in the subtraction result value X and supplies the exclusive OR output to the OR gate OR4. The OR gate OR2 takes logical OR of the exclusive OR outputs supplied from the exclusive OR circuits EX7 and EX8, and supplies the resulting logical OR to a selection terminal S of respective selectors SE9–SE12. The OR gate OR3 takes logical OR of the exclusive OR outputs supplied from the exclusive OR circuits EX7 and EX9, and supplies the resulting logical OR to each of an input terminal $P_1$ of the selector SE9, an input terminal $P_0$ of a selector SE11, and an invertor IV5. The invertor IV5 inverts the logical value of the logical OR supplied from the OR gate OR3, and supplies the inverted logical value to an input terminal $P_1$ of the selector SE10. The OR gate OR4 takes logical OR of the exclusive OR outputs supplied from the exclusive OR circuits EX7 and EX10, and supplies the resulting logical OR to each of an input terminal $P_1$ of the selector SE11 and an input terminal $P_0$ of the selector SE12.

The selectors SE9–SE12 are 2-to-1 selectors which have the same internal configuration as the selectors SE1–SE4 shown in FIG. 7. The selector SE9–SE12 select the signals supplied to their input terminals $P_0$ as branchmetric values $Y_0$–$Y_3$, respectively, when a logical "0" signal is supplied to its selection terminal S, and select the signals supplied to their input terminals $P_1$ as the branchmetric values $Y_0$–$Y_3$ when a logical "1" signal is supplied to the selection terminal S.

As described above, by providing the limiting function in the branchmetric calculation circuit, the number of bits required to the calculation can be reduced, so that the scale of circuit subsequent to the branchmetric calculation circuit, i.e., a circuit for pathmetric calculation can also be reduced.

Figure 19:
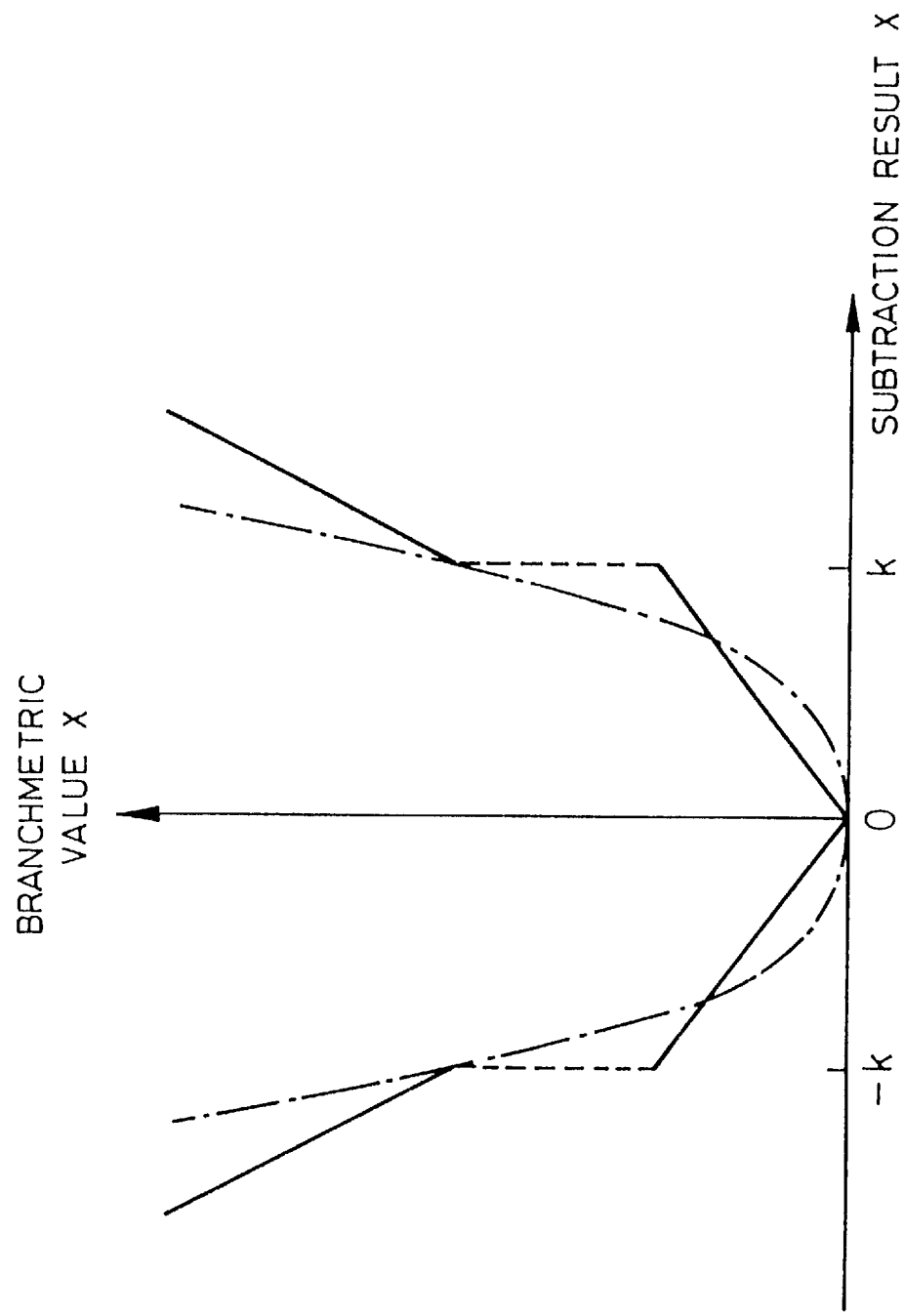
FIG. 19 is a graph showing an example of the broken-line approximation function for the square calculation by the branchmetric calculation circuit of the present invention.

It should be noted that in the foregoing embodiments, the respective linear functions for the broken line approximation function are continuous, they may be discontinuous as indicated by a solid line in FIG. 19.

It will be appreciated from the foregoing description that the branchmetric calculation circuit in a Viterbi decoder according to the present invention is configured to perform the square calculation for deriving a square value of a subtraction result value between a received sample value and a predicted sample value in the form of broken line approximation using a plurality of linear functions.

It is therefore possible, according to the present invention, to realize faster processing with a smaller scale circuit configuration as compared with a conventional branchmetric calculation circuit which derives branchmetric values by the square calculation processing using a multiplier.

What is claimed is:

1. A branchmetric calculation circuit in a Viterbi decoder which calculates a square error between a received value and a predicted value as a branchmetric value and produces a decoded data sequence based on said branchmetric value, comprising:

subtracting means for subtracting said predicted value from said received value to derive a subtraction value; and broken line converting means for converting said subtraction value to an approximation value of a square value using one of a plurality of linear functions and utilizing the resulting value as said branchmetric value.

2. A branchmetric calculation circuit in a Viterbi decoder according to claim 1, wherein a gradient of said linear functions is $2^N$, where N is an integer.

* * * * *